US010248023B1

(12) United States Patent
Aihara et al.

(10) Patent No.: US 10,248,023 B1
(45) Date of Patent: Apr. 2, 2019

(54) METHOD OF MANUFACTURING SEMICONDUCTOR DEVICE

(71) Applicant: Mitsubishi Electric Corporation, Tokyo (JP)

(72) Inventors: Yasuki Aihara, Tokyo (JP); Kazuyuki Onoe, Tokyo (JP); Takahiro Ueno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/898,677

(22) Filed: Feb. 19, 2018

(30) Foreign Application Priority Data

Sep. 14, 2017 (JP) ................... 2017-176765

(51) Int. Cl.
| | |
|---|---|
| G03F 7/16 | (2006.01) |
| G03F 7/00 | (2006.01) |
| H01L 21/306 | (2006.01) |
| H01L 21/027 | (2006.01) |
| G03F 7/40 | (2006.01) |

(52) U.S. Cl.
CPC ............ G03F 7/168 (2013.01); G03F 7/0035 (2013.01); G03F 7/40 (2013.01); H01L 21/0273 (2013.01); H01L 21/306 (2013.01)

(58) Field of Classification Search
CPC ....................................................... G03F 7/168
See application file for complete search history.

(56) References Cited

U.S. PATENT DOCUMENTS

2005/0147923 A1* 7/2005 Sawada ............ H01L 21/28587
430/314
2014/0273513 A1  9/2014 Mita et al.

FOREIGN PATENT DOCUMENTS

| JP | H02-063059 A | 3/1990 |
|---|---|---|
| JP | 2003-007729 A | 1/2003 |
| JP | 2014-182187 A | 9/2014 |

* cited by examiner

Primary Examiner — Roberts P Culbert
(74) Attorney, Agent, or Firm — Studebaker & Brackett PC

(57) ABSTRACT

A method of manufacturing a semiconductor device includes: coating a first resist containing a photoacid generator or a thermal acid generator on a semiconductor substrate; forming a first opening portion in the first resist by optical exposure; subjecting a shrink agent containing an acid to a crosslinking reaction by the heat treatment to form a thermoset layer on an overall surface of the first resist; coating a second resist on the semiconductor substrate and the thermoset layer; and forming a second opening portion located above the first opening portion and larger than the first opening portion in the second resist by optical exposure.

11 Claims, 9 Drawing Sheets

METHOD OF MANUFACTURING SEMICONDUCTOR DEVICE

BACKGROUND OF THE INVENTION

Field

The present invention relates to a method of manufacturing a semiconductor device forming a fine opening portion in a resist.

Background

There has been disclosed a method of forming a fine opening portion in a resist by using a shrink agent which causes a crosslinking reaction with an acid occurring in the resist (for example, see JP2003-7729A).

SUMMARY

The shrink agent contains a material which causes the crosslinking reaction under the presence of an acid. A layer which has been subjected to the crosslinking reaction is called as a thermoset layer. A thermoset layer is formed around an opening portion at which the acid occurring from the resist under exposure remains. Furthermore, an acid also occurs when the resist is subjected to heat treatment. Therefore, a thermoset layer is also formed at other portions than the resist opening portion by a conventional method, but the thus-formed thermoset layer is thin and insufficient as compared with that at the opening portion. Therefore, when a second resist is formed on a shrunk first resist, mixing occurs between both the resists, which causes a problem that it is impossible to stably form fine opening portions in the first and second resists.

The present invention has been implemented to solve the foregoing problem, and has an object to provide a method of manufacturing a semiconductor device that is capable of stably forming an opening portion in a resist.

According to the present invention, a method of manufacturing a semiconductor device includes: coating a first resist containing a photoacid generator or a thermal acid generator on a semiconductor substrate; forming a first opening portion in the first resist by optical exposure; subjecting a shrink agent containing an acid to a crosslinking reaction by the heat treatment to form a thermoset layer on an overall surface of the first resist; coating a second resist on the semiconductor substrate and the thermoset layer; and forming a second opening portion located above the first opening portion and larger than the first opening portion in the second resist by optical exposure.

Since the shrink agent containing the acid is used in the present invention, a sufficiently thick thermoset layer can be formed on the overall surface of the first resist. Furthermore, the thick thermoset layer serves as a barrier to suppress the mixing between the first resist and the second resist. As a result, the first and second opening portions can be stably formed in the first and second resists.

Other and further objects, features and advantages of the invention will appear more fully from the following description.

DESCRIPTION OF EMBODIMENTS

A method of manufacturing a semiconductor device according to the embodiments of the present invention will be described with reference to the drawings. The same components will be denoted by the same symbols, and the repeated description thereof may be omitted.

First Embodiment

Figure 1:
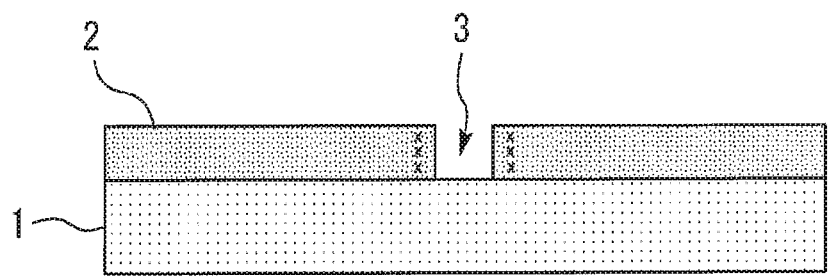
FIGS. 1 to 5 are cross-sectional views showing a method of manufacturing a semiconductor device according to a first embodiment.

FIGS. 1 to 5 are cross-sectional views showing a method of manufacturing a semiconductor device according to a first embodiment. As shown in FIG. 1, a first resist 2 is first coated on a semiconductor substrate 1 of GaAs or the like. A first opening portion 3 is formed in the first resist 2 by optical exposure. The first resist 2 is Sumiresist PFI-58A6 manufactured by Sumitomo Chemical Co. Ltd., for example. Here, the acid occurring from the first resist 2 under exposure remains around the first opening portion 3.

Figure 2:
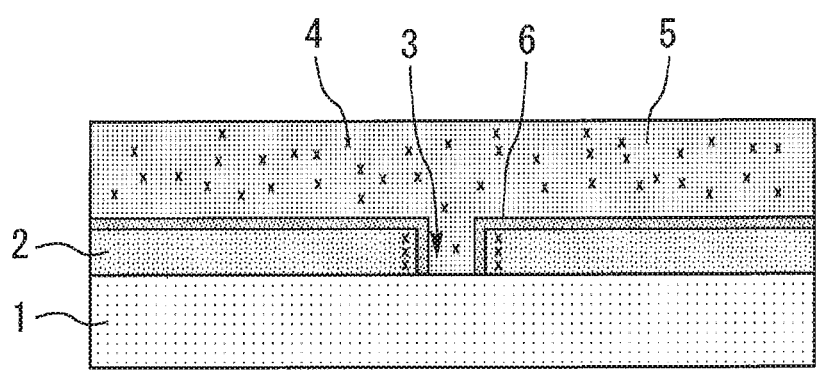

Next, a shrink agent 5 containing an acid 4 is coated on the whole surface as shown in FIG. 2. The shrink agent 5 causes a crosslinking reaction when it is subjected to heat treatment under the presence of the acid 4. However, the amount of the acid 4 is controlled so that the shrink agent 5 does not cause a sufficient crosslinking reaction by only the acid 4 contained in the shrink agent 5. Here, the sufficient crosslink reaction means that the reaction progresses to the extent that a crosslinked product cannot be removed by a developing processing. Addition of the acid occurring from the first resist 2 through the heat treatment makes the shrink agent 5 cause the crosslinking reaction, thereby forming a thermoset layer 6 on the overall surface of the first resist 2.

Figure 3:
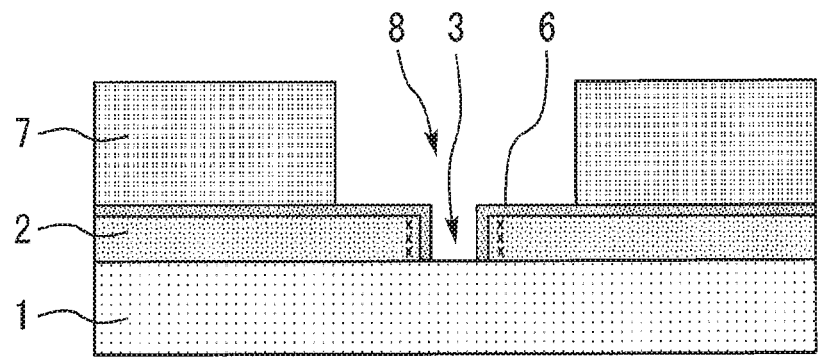

Next, as shown in FIG. 3, a second resist 7 is coated on the semiconductor substrate 1 and the thermoset layer 6. A second opening portion 8 is formed in the second resist 7 by optical exposure. The second opening portion 8 is located above the first opening portion 3, and formed to be larger than the first opening portion 3.

Figure 4:
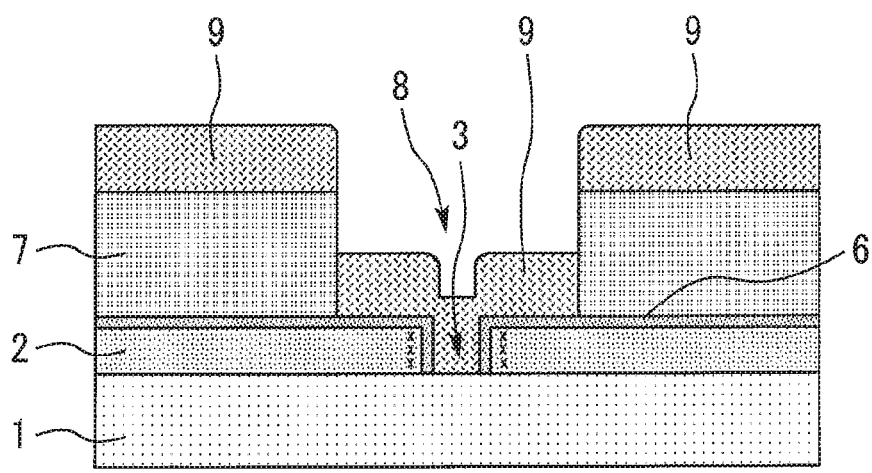
Figure 5:
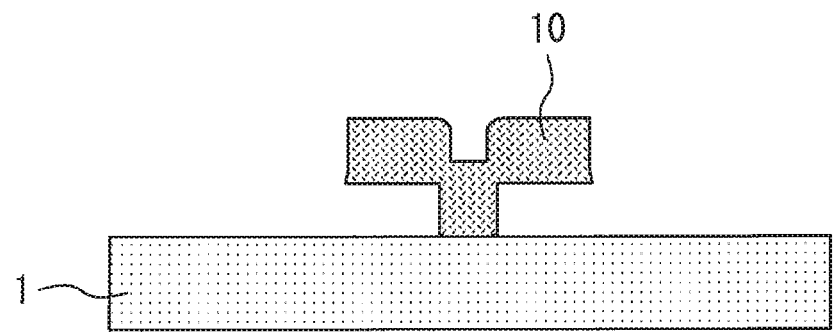

Next, a metal film 9 is formed on the semiconductor substrate 1, the thermoset layer 6 and the second resist 7 as shown in FIG. 4. Next, as shown in FIG. 5, the first and second resists 2 and 7, and the thermoset layer 6 are removed, and the metal film 9 on the second resist 7 is also removed by lift-off, thereby forming a T-shaped electrode 10.

Here, since the first resist 2 contains a photoacid generator or a thermal acid generator, a thermoset layer 6 is formed on the surface of the first resist 2 by the acid occurring from the first resist 2 under the exposure and under the heat treatment even when the shrink agent 5 does not contain any acid 4. However, since the amount of acid is insufficient, only a thin thermoset layer 6 is formed, and mixing occurs between the first resist 2 and the second resist 7, so that the first and second opening portions 3 and 8 cannot be stably formed. On the other hand, since the shrink agent 5 containing the acid 4 is used in this embodiment, a sufficiently thick thermoset layer 6 can be formed on the overall surface of the first resist 2. Furthermore, the thick thermoset layer 6 serves as a barrier to suppress the mixing between the first resist 2 and the second resist 7. As a result, the first and second opening portions 3 and 8 can be stably formed in the first and second resists 2 and 7.

Second Embodiment

Figure 6:
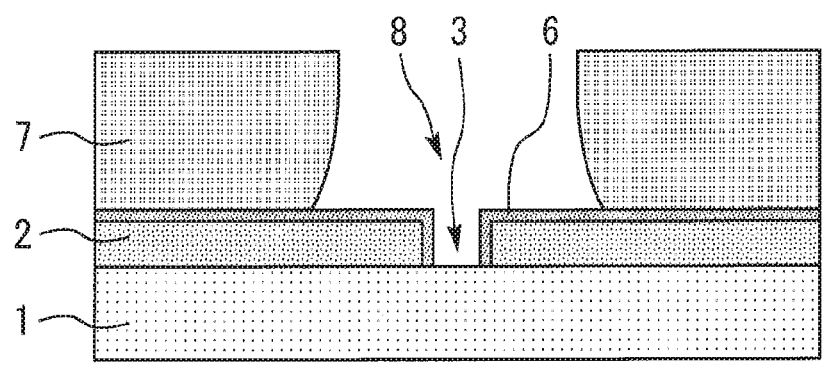
FIGS. 6 and 7 are cross-sectional views showing a method of manufacturing a semiconductor device according to a second embodiment
Figure 7:
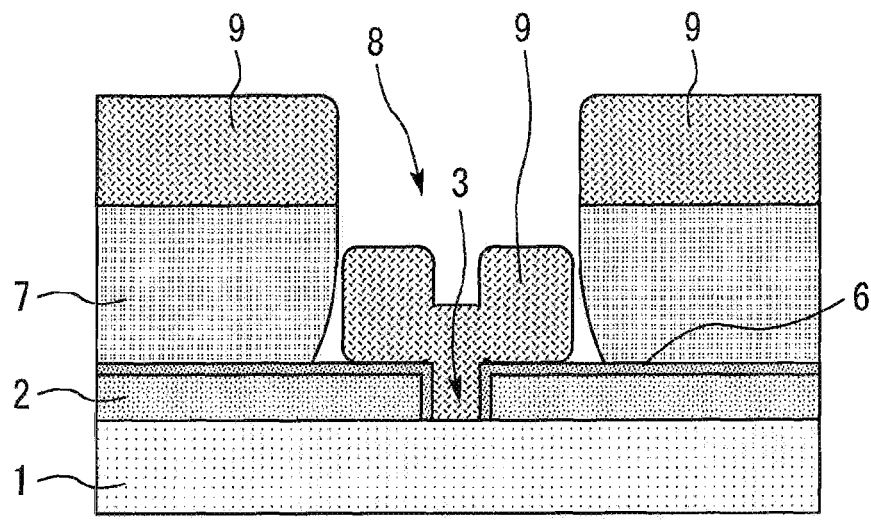

FIGS. 6 and 7 are cross-sectional views showing a method of manufacturing a semiconductor device according to a second embodiment. The steps up to the step of forming the thermoset layer 6 on the first resist 2 are the same as the steps of the first embodiment. Next, as shown in FIG. 6, a second resist 7 which is an image reversal resist is coated, and a second opening portion 8 is formed in the second resist 7 by optical exposure.

Next, a metal film 9 is formed on the semiconductor substrate 1, the thermoset layer 6 and the second resist 7 by vapor deposition as shown in FIG. 7. Thereafter, the first and second resists 2 and 7 and the thermoset layer 6 are removed, and the metal film 9 on the second resist 7 is also removed by lift-off, thereby forming a T-shaped electrode 10.

As described above, in this embodiment, the second opening portion 8 is formed in an overhang-shape by using the image reversal resist as the second resist 7. As a result, the metal film 9 on the second resist 7 and the metal film 9 in the second opening portion 8 are easily separated, so that the T-shaped electrode 10 can be easily formed by a vapor deposition lift-off method.

Third Embodiment

Figure 8:
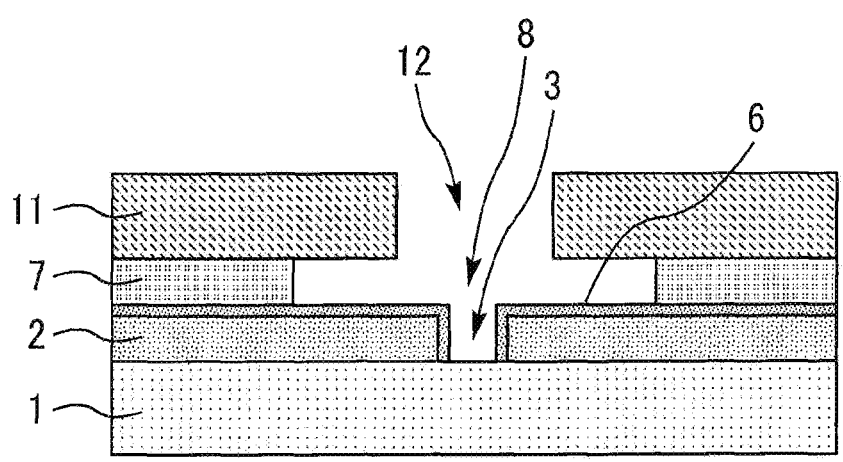
FIGS. 8 and 9 are cross-sectional views showing a method of manufacturing a semiconductor device according to a third embodiment.
Figure 9:
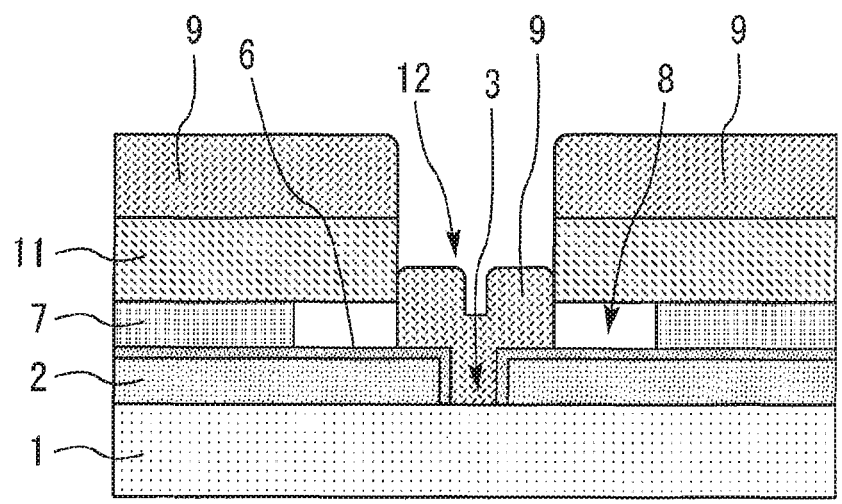

FIGS. 8 and 9 are cross-sectional views showing a method of manufacturing a semiconductor device according to a third embodiment. The steps up to the step of forming the thermoset layer 6 on the first resist 2 are the same as the steps of the first embodiment. Next, as shown in FIG. 8, the second resist 7 is coated, and a third resist 11 is coated on the second resist 7. All of these resists are positive type photoresists, and a combination of these resists is selected so that the second resist 7 has higher exposure sensitivity than the third resist 11. A second opening portion 8 is formed in the second resist 7 by optical exposure, and a third opening portion 12 is formed in the third resist 11. The optical exposure is performed under such a condition that the third opening portion 12 is located above the first and second opening portions 3 and 8, and is larger than the first opening portion 3 and smaller than the second opening portion 8. As a result, the cross-sectional shapes of the second and third resists 7 and 11 become an overhang-shape.

Next, the metal film 9 is formed on the overall surface as shown in FIG. 9. Thereafter, the first, second and third resists 2, 7 and 11 and the thermoset layer 6 are removed, and the metal film 9 on the third resist 11 is also removed by lift-off, thereby forming a T-shaped electrode 10.

As described above, in this embodiment, the T-shaped electrode 10 can be easily formed according to the vapor deposition lift-off method by using the resist having the overhang-shaped cross-section.

Fourth Embodiment

Figure 10:
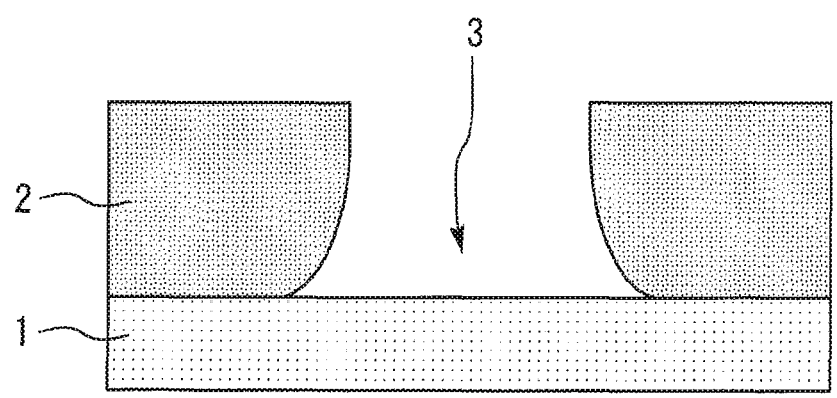
FIGS. 10 to 13 are cross-sectional views showing a method of manufacturing a semiconductor device according to a fourth embodiment.
Figure 11:
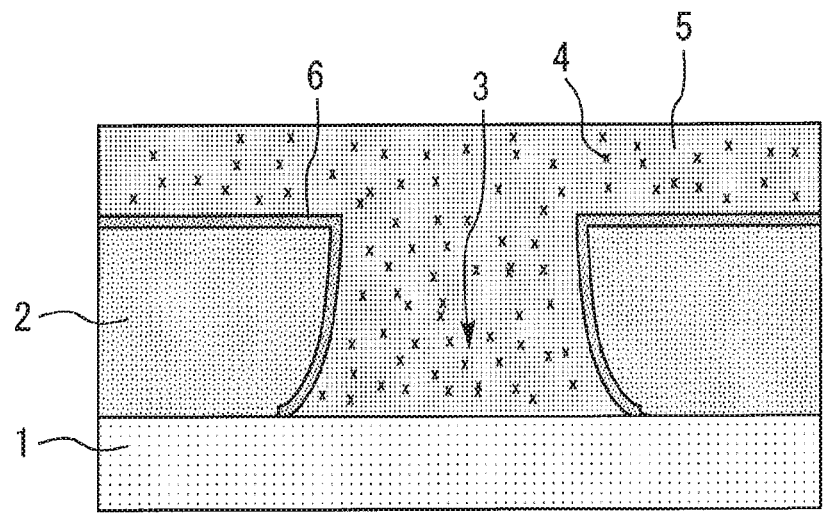

FIGS. 10 to 13 are cross-sectional views showing a method of manufacturing a semiconductor device according to a fourth embodiment. As shown in FIG. 10, a first resist 2 which is an image reversal resist is coated on the semiconductor substrate 1. A first opening portion 3 having an overhang-shape is formed in the first resist 2 by optical exposure. Next, as shown in FIG. 11, a shrink agent 5 containing an acid 4 is coated, and the shrink agent 5 is subjected to the crosslinking reaction by the heat treatment, thereby forming the thermoset layer 6 on the overall surface of the first resist 2.

Figure 12:
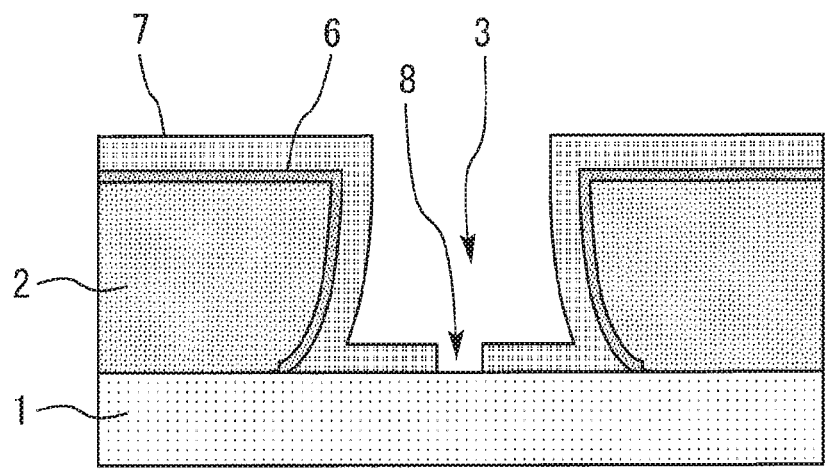

Next, the second resist 7 is coated on the semiconductor substrate 1 and the thermoset layer 6 as shown in FIG. 12. A second opening portion 8 is formed in the second resist 7 by optical exposure. The second opening portion 8 is arranged inside the first opening portion 3, and set to be smaller than the first opening portion 3.

Figure 13:
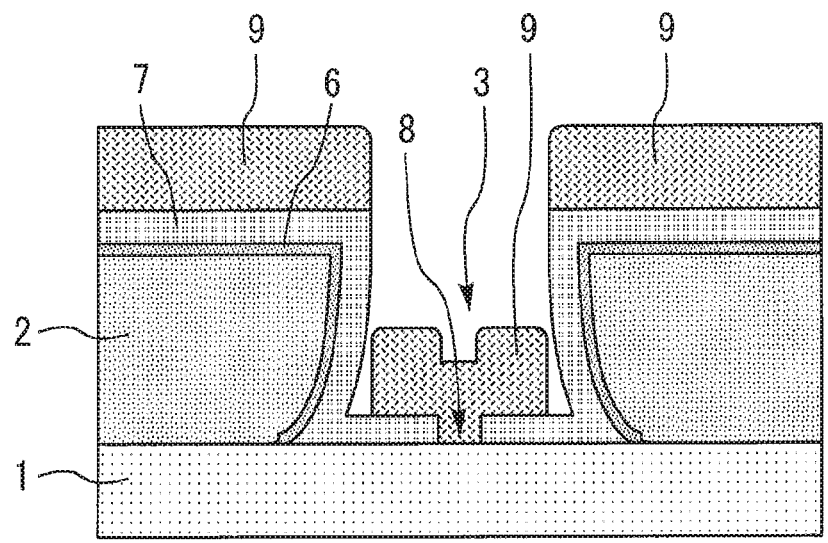

Next, the metal film 9 is formed on the overall surface as shown in FIG. 13. Thereafter, the first and second resists 2 and 7 and the thermoset layer 6 are removed, and the metal film 9 on the second resist 7 is also removed by lift-off, thereby forming a T-shaped electrode 10.

As described above, in this embodiment, the first resist 2 can be formed in an overhang-shape by using the image reversal resist. Therefore, the T-shaped electrode 10 can be easily formed by the vapor deposition lift-off method. The same other effects as the first embodiment can be obtained.

Fifth Embodiment

Figure 14:
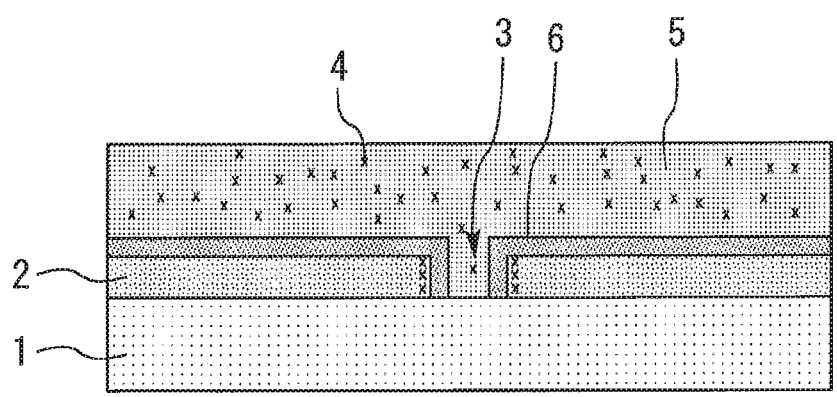
FIG. 14 is a cross-sectional view showing a method of manufacturing a semiconductor device according to a fifth embodiment.

FIG. 14 is a cross-sectional view showing a method of manufacturing a semiconductor device according to a fifth embodiment. In this embodiment, the step of forming the thermoset layer 6 by making the shrink agent 5 cause the crosslinking reaction in the first to third embodiments is repeated multiple times, whereby the thermoset layer 6 on the surface of the first resist 2 can be formed so as to have a large thickness. Since the thermoset layer 6 is thick, the first opening portion 3 of the first resist 2 can be further reduced in size. Furthermore, since a large barrier effect for mixing can be obtained, the first and second opening portions 3 and 8 can be more stably formed in the first and second resists 2 and 7. The same effect can be also obtained by repeating, multiple times, the step of making the shrink agent 5 cause the crosslinking reaction in the fourth embodiment to form the thermoset layer 6.

Sixth Embodiment

Figure 15:
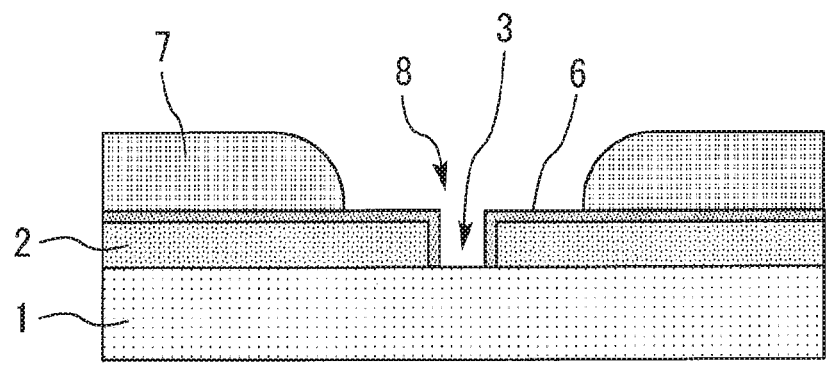
FIGS. 15 to 18 are cross-sectional views showing a method of manufacturing a semiconductor device according to a sixth embodiment.

FIGS. 15 to 18 are cross-sectional views showing a method of manufacturing a semiconductor device according to a sixth embodiment. The steps up to the step of forming the thermoset layer 6 on the first resist 2 are the same as the steps of the first embodiment. Next, as shown in FIG. 15, the second resist 7 is coated on the semiconductor substrate 1 and the thermoset layer 6. A second opening portion 8 which is located above the first opening portion 3 and larger than the first opening portion 3 is formed in the second resist 7 by optical exposure.

Figure 16:
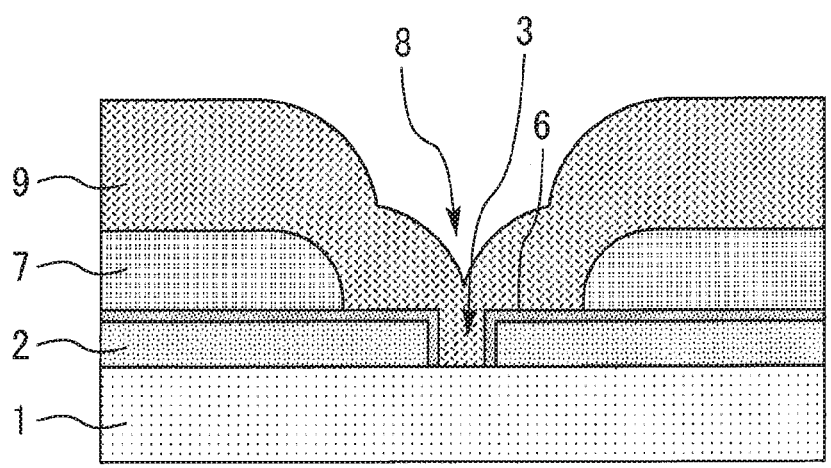
Figure 17:
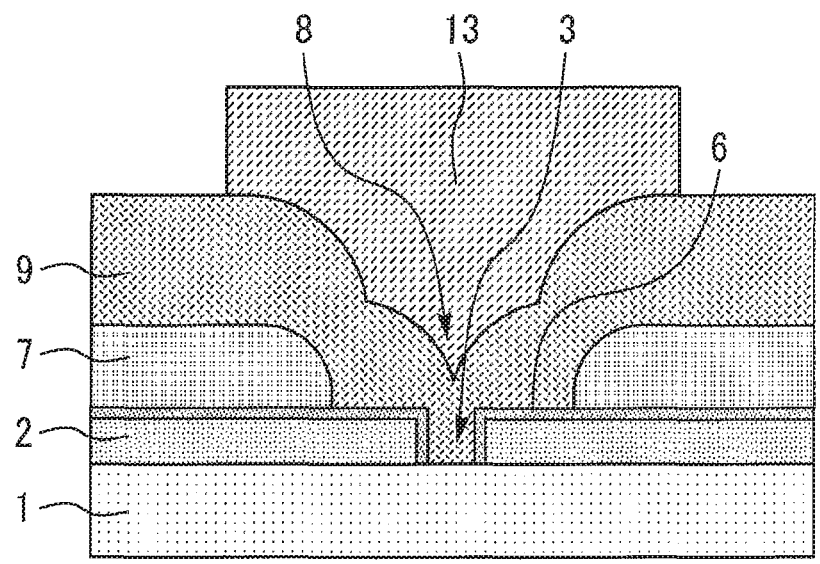
Figure 18:
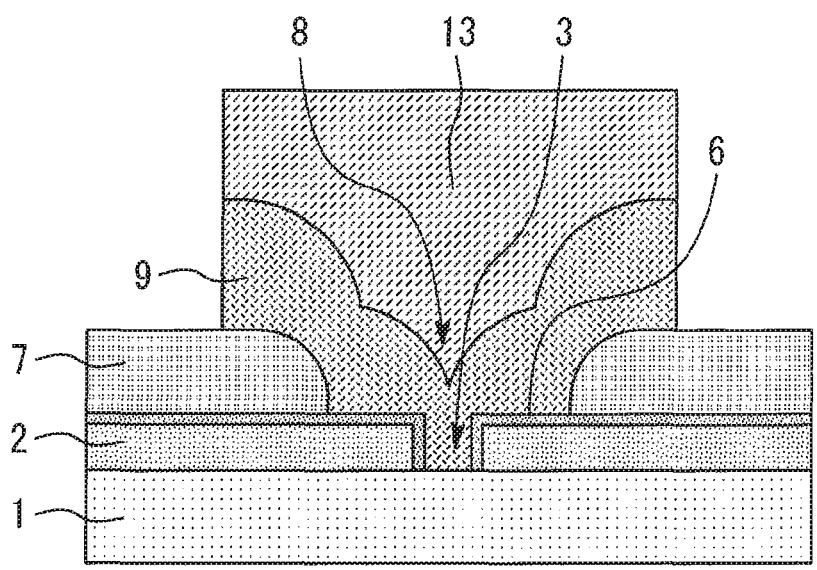

Next, as shown in FIG. 16, a metal film 9 is formed on the semiconductor substrate 1, the thermoset layer 6 and the second resist 7 by a sputtering method. Next, as shown in FIG. 17, a third resist 13 which is larger than the second opening portion 8 is formed on the metal film 9 above the first and second opening portions 3 and 8. Next, as shown in FIG. 18, the metal film 9 is subjected to anisotropic etching by using the third resist 13 as a mask according to a milling method or the like. As a result, the T-shaped electrode 10 can be formed without forming the second resist 7 in an overhang-shape.

In the first to sixth embodiments, a shrink agent 5 containing a thermal acid generator or a photoacid generator in place of the acid 4 may be used. In this case, the same effect can be obtained by generating the acid 4 through heat treatment and light irradiation.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-176765, filed on Sep. 14, 2017 including specification, claims, drawings and summary, on which the Convention priority of the present application is based, is incorporated herein by reference in its entirety.

The invention claimed is:

1. A method of manufacturing a semiconductor device comprising:
    coating a first resist containing a photoacid generator or a thermal acid generator on a semiconductor substrate;
    forming a first opening portion in the first resist by optical exposure;
    subjecting a shrink agent containing an acid to a crosslinking reaction by the heat treatment to form a thermoset layer on an overall surface of the first resist;
    coating a second resist on the semiconductor substrate and the thermoset layer; and
    forming a second opening portion located above the first opening portion and larger than the first opening portion in the second resist by optical exposure.

2. The method of manufacturing a semiconductor device according to claim 1, further comprising:
    forming a metal film on the semiconductor substrate, the thermoset layer and the second resist; and
    removing the metal film on the second resist by lift-off,
    wherein the second opening portion is formed in an overhang-shape by using an image reversal resist as the second resist.

3. The method of manufacturing a semiconductor device according to claim 1, further comprising:
    coating a third resist on the second resist; and
    forming a third opening portion, which is located above the first and second opening portions and is larger than the first opening portion and smaller than the second opening portion, in the third resist by optical exposure.

4. The method of manufacturing a semiconductor device according to claim 1, wherein the step of forming the thermoset layer by making the shrink agent cause the crosslinking reaction is repeated multiple times.

5. The method of manufacturing a semiconductor device according to claim 1, further comprising:
    forming a metal film on the semiconductor substrate, the thermoset layer and the second resist;
    forming a third resist which is larger than the second opening portion on the metal film above the first and second opening portions; and
    etching the metal film by using the third resist as a mask.

6. The method of manufacturing a semiconductor device according to claim 1, wherein an amount of the acid is controlled so that the shrink agent does not cause a sufficient crosslinking reaction by only the acid contained in the shrink agent.

7. The method of manufacturing a semiconductor device according to claim 1, wherein the shrink agent contains a thermal acid generator or a photoacid generator, and the acid is generated through heat treatment or light irradiation.

8. A method of manufacturing a semiconductor device comprising:
    coating a first resist which is an image reversal resist on a semiconductor substrate;
    forming a first opening portion having an overhang-shape in the first resist by optical exposure;
    subjecting a shrink agent containing an acid to a crosslinking reaction by the heat treatment to form a thermoset layer on an overall surface of the first resist;
    coating a second resist on the semiconductor substrate and the thermoset layer; and
    forming a second opening portion arranged inside the first opening portion and smaller than the first opening portion in the second resist by optical exposure.

9. The method of manufacturing a semiconductor device according to claim 8, wherein the step of forming the thermoset layer by making the shrink agent cause the crosslinking reaction is repeated multiple times.

10. The method of manufacturing a semiconductor device according to claim 8, wherein an amount of the acid is controlled so that the shrink agent does not cause a sufficient crosslinking reaction by only the acid contained in the shrink agent.

11. The method of manufacturing a semiconductor device according to claim 8, wherein the shrink agent contains a thermal acid generator or a photoacid generator, and the acid is generated through heat treatment or light irradiation.

* * * * *